United States Patent [19]
Whitten

[11] 4,091,342
[45] May 23, 1978

[54] TIME DELAY MODULATOR

[75] Inventor: James R. Whitten, Scotia, N.Y.

[73] Assignee: General Electric Company, Schenectady, N.Y.

[21] Appl. No.: 798,844

[22] Filed: May 20, 1977

Related U.S. Application Data

[63] Continuation of Ser. No. 646,249, Jan. 2, 1976, abandoned.

[51] Int. Cl.² ............................................. H03C 3/10
[52] U.S. Cl. .................................. 332/29 R; 307/293; 325/145; 331/111; 331/177 R; 332/4; 332/26; 333/29
[58] Field of Search .................. 332/4, 9, 10, 16 R, 332/26, 29 R; 333/29; 328/55, 56; 307/293; 325/45, 145; 179/15.55 T

[56] References Cited

U.S. PATENT DOCUMENTS

| | | | |
|---|---|---|---|
| 2,923,891 | 2/1960 | Nicholson, Jr. | 332/16 R |
| 3,444,396 | 5/1969 | Fox | 328/55 X |
| 3,546,490 | 12/1970 | Sangster | 307/246 X |
| 3,559,103 | 10/1965 | Cooper | 332/9 R |
| 3,947,874 | 3/1976 | Lentz | 360/36 |
| 3,959,597 | 5/1976 | Keiser | 179/15.55 T |

OTHER PUBLICATIONS

Davies et al., Electronics Letters, 24 Jan. 1974, vol. 10, No. 2, pp. 21, 22.

Primary Examiner—Siegfried H. Grimm
Attorney, Agent, or Firm—Jerome C. Squillaro; Joseph T. Cohen; Marvin Snyder

[57] ABSTRACT

A time delay modulator is disclosed in which the instantaneous time base of a carrier signal is varied in accordance with a modulating signal. In one embodiment, modulation is achieved through the use of charge transfer delay lines and variable frequency clocks in which a carrier wave signal is applied to the input of the delay line and the carrier wave signal is propagated through the delay line at a rate determined by the output frequency of an oscillator which deviates from a nominal frequency by an amount proportionate to the magnitude of the modulating signal. In another embodiment, an analog-to-digital converter, a shift register and a digital-to-analog converter in serial configuration are each controlled by a voltage controlled oscillator. The carrier wave signal is connected to the input of the analog-to-digital converter and samples are taken in accordance with a clock input. Parallel digital output signals are applied to an N x M bit shift register, the output of which is applied to the digital-to-analog converter having a serial output. A modulating signal is applied to the voltage controlled oscillator which provides an output deviating from a nominal frequency by an amount proportional to the magnitude of the modulating signal.

4 Claims, 19 Drawing Figures

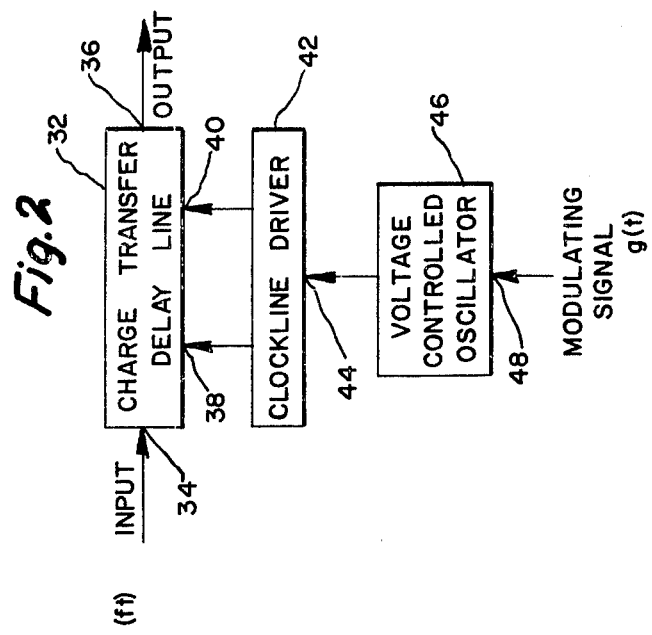
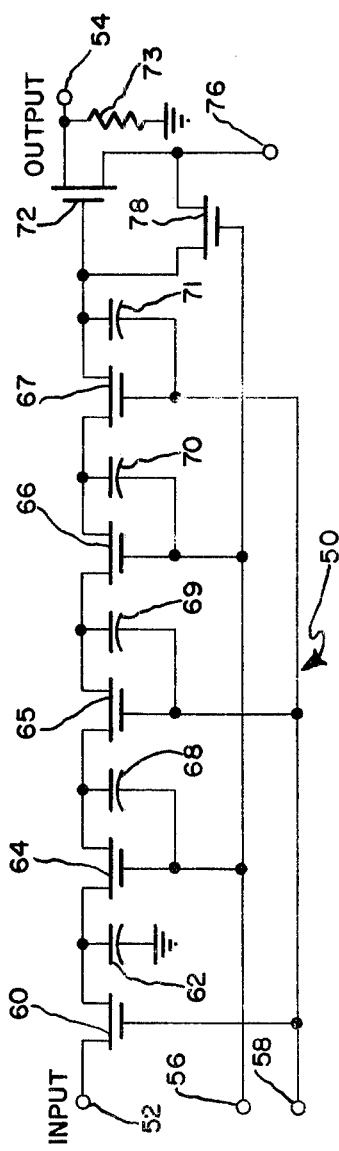
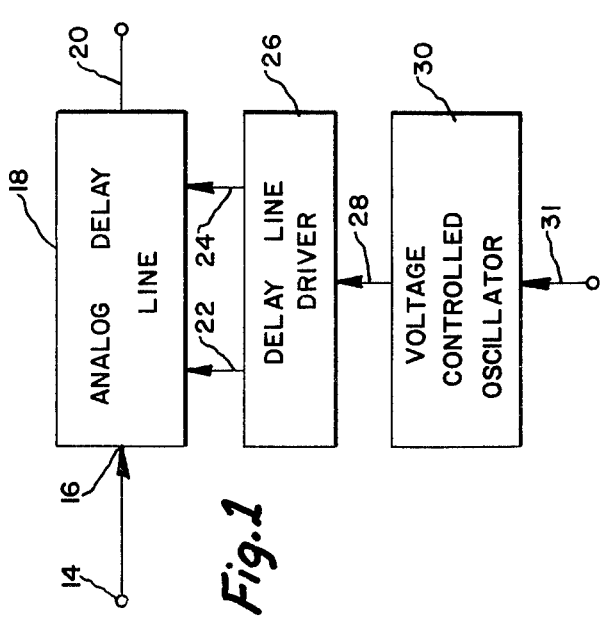
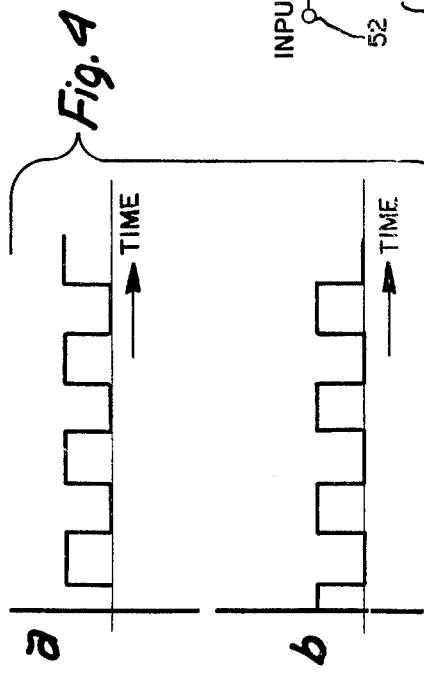

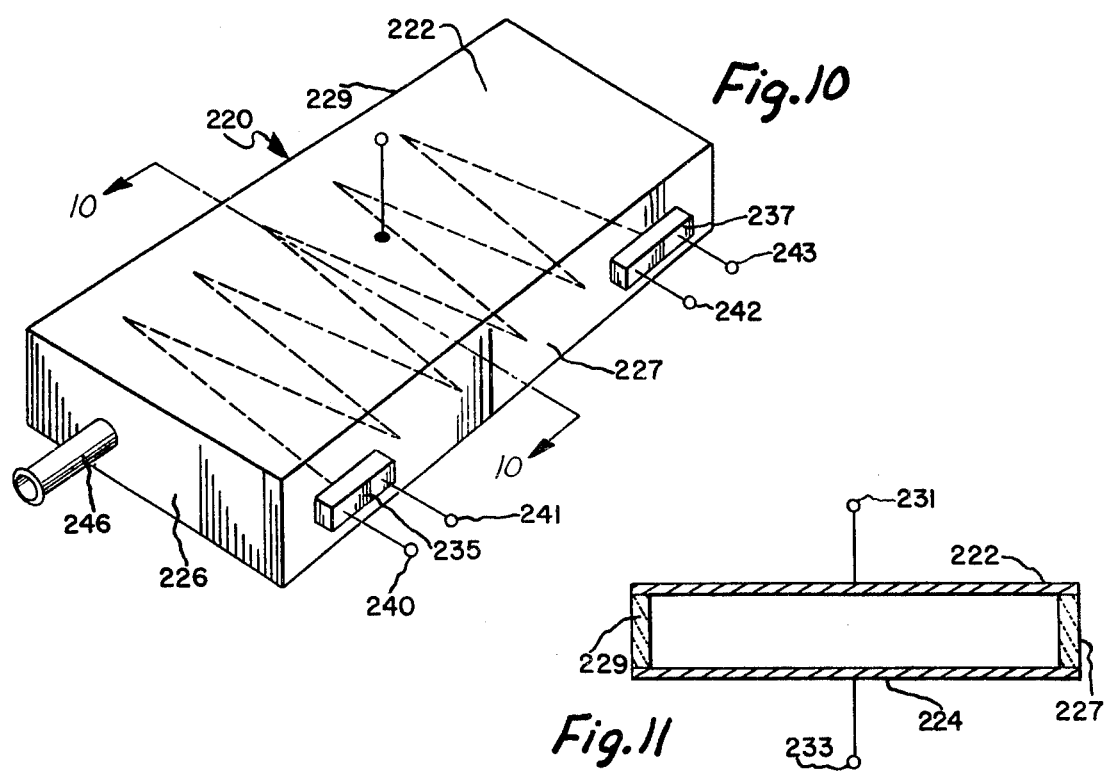
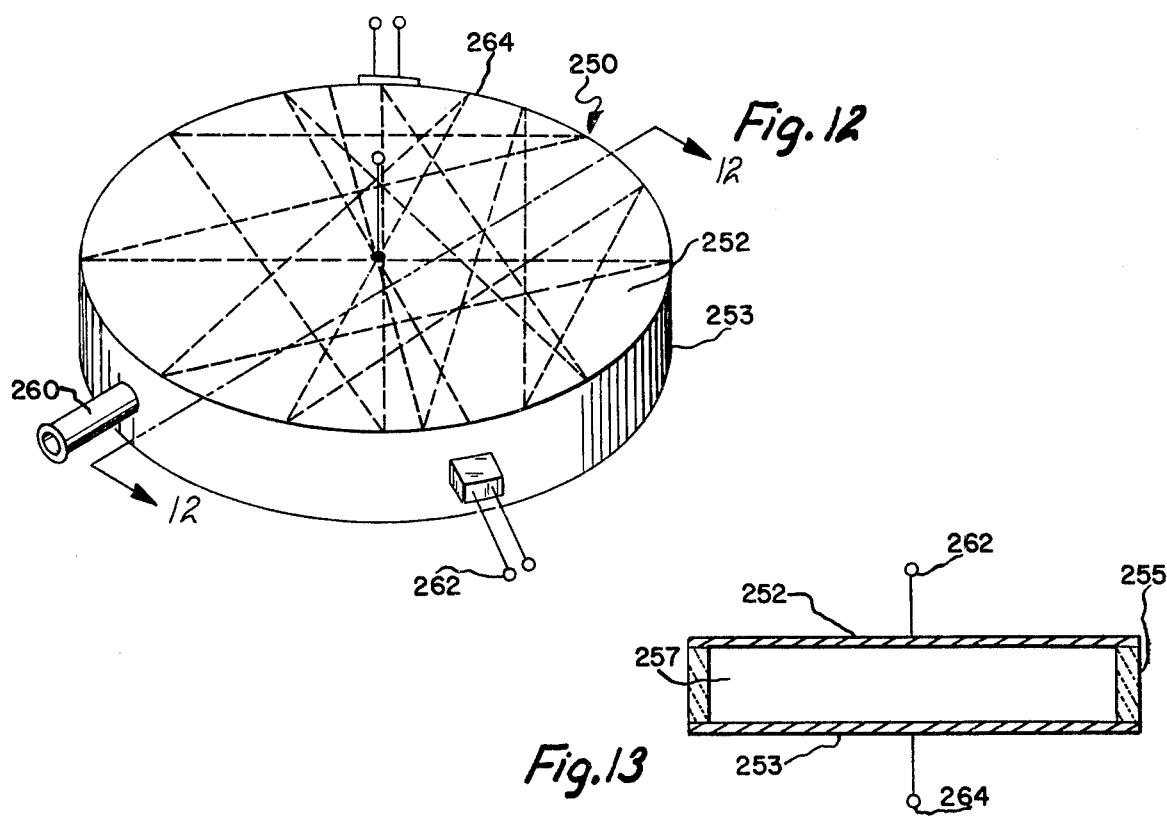

TIME DELAY MODULATOR

This application is a continuation of application Ser. No. 646,249, filed Jan. 2, 1976, now abandoned.

This invention relates, in general, to communications systems and, more specifically, to systems for transmitting information over a communications channel by modulating a carrier signal with an information containing modulation signal. This invention is specifically concerned with modulating the time base of the carrier signal in order to convey the information.

The modulation of a carrier waveform with an information containing waveform is well known in the art. Early examples include the most rudimentary forms of modulation as, for example, interrupted continuous wave modulation, forms of which were utilized by Morse himself. Insofar as is known, it has never been proposed to transmit modulation, on a carrier wave by causing deviation of the time base thereof in accordance with a modulating signal. Certain specific examples of time delay modulation in accordance with this invention produce output signals which substantially resemble the output signals produced by prior art forms of modulation. For example, in accordance with this invention, where a carrier is provided of substantially constant sinusoidal wave shape and a modulating signal of substantially lower relative frequency is utilized, a waveform is produced which is substantially similar to that which would be provided by phase modulation as is well known in the art utilizing the same carrier and modulating signals. Time delay modulation, in accordance with this invention, is not limited to particular carrier and modulating waveforms as are prior art modulation methods which produce certain specific outputs which may be produced by time delay modulation. The distinction is somewhat analogous to the distinction between phase and frequency modulation techniques which, as is well known produce, in certain instances, identical output waveforms but which are distinct modulation techniques.

It is an object of this invention to provide a method and apparatus for the transmission of information over a medium and specifically to provide a method and apparatus for modulating a carrier wave with an information containing modulating signal, the modulation to take place in the time domain.

It is another object of this invention to provide time delay modulation apparatus for modulating and for demodulating a time delay modulated signal.

It is yet another object of this invention to provide a time delay modulator and demodulator which may be implemented utilizing integrated circuit devices for the purpose of providing low cost, reproducibility, ease of manufacture, and compatibility with similarly implemented communications systems.

Briefly stated and in accordance with one aspect of this invention, a time delay modulator is provided wherein the instantaneous time base of a carrier signal is varied in accordance with a modulating signal. In accordance with one embodiment of this invention, a sampled delay line, which may, for example, be a bucket brigade delay line or other charge transfer delay line, is utilized to obtain the desired time delay modulation function. The carrier wave signal is applied to an input of the delay line and the modulating signal is applied to an oscillator circuit characterized by an output frequency which deviates from a nominal output frequency by an amount proportional to the value of the modulating signal. The output of this oscillator is connected to a clock driver circuit which supplies signals of appropriate polarity and signal level to the delay line at a frequency corresponding to the output frequency of the oscillator.

Another embodiment of this invention includes the combination of an analog-to-digital converter, a shift register and a digital-to-analog converter in serial form each controlled by a voltage controlled oscillator. The carrier wave signal is supplied to the input of the analog-to-digital converter and samples are taken in accordance with a clock input. Parallel digital output signals are applied to an NxM bit shift register, the output of which is applied to a digital-to-analog converter having a serial output. A modulating signal is applied to the input of a voltage controlled oscillator or the like which provides an output at a nominal frequency when the value of the modulating signal is at a zero or nominal level and an output frequency which deviates from the nominal value in an amount proportional to a nonzero modulating signal.

The features of the invention which are believed to be novel are pointed out with particularity in the appended claims. The invention itself, however, both as to its organization and method of operation together with further objects and advantages thereof may best be understood by reference to the following description taken in connection with the accompanying drawings in which:

FIG. 1 is a block diagram schematic of a time delay modulator in accordance with this invention.

FIG. 2 is a block diagram schematic of a time delay modulator utilizing a charge transfer delay line.

FIG. 3 is a schematic diagram of an exemplary charge transfer delay line in accordance with this invention.

FIG. 4 is a waveform diagram of clock line signals which may be appropriately utilized in conjunction with the delay line of FIG. 3.

FIG. 10 is a schematic diagram of an electroacoustical delay line in accordance with this invention.

FIG. 11 is a section of FIG. 10.

FIG. 12 is a diagram of an alternative electroacoustical delay line.

FIG. 13 is a section of FIG. 12.

Figure 5:
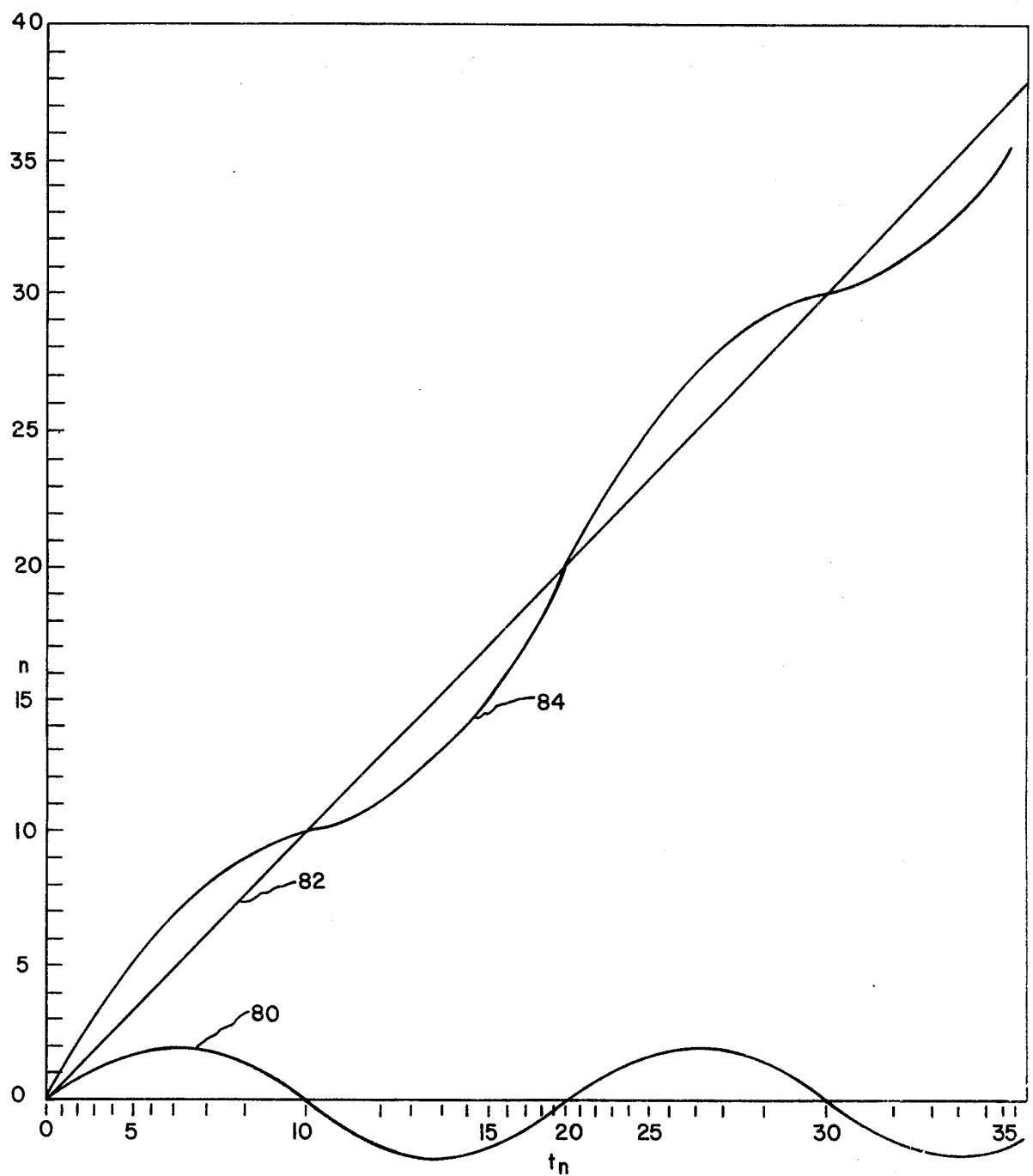
FIG. 5 is a graphical representation of certain time delay modulated waveforms.

While time delay modulators may be implemented as will be described, in a wide variety of forms, FIG. 1 illustrates a form of time delay modulator which may be particularly advantageously employed in accordance with this invention in a wide range of applications. An input terminal 14 is adapted to be connected to a first input signal generally designated $f(t)$. Input signal $f(t)$ is applied to input 16 of analog delay line 18 which is provided with an output 20 and control inputs 22 and 24. Delay line driver 26 provides driving signals to inputs 22 and 24 to control the propagation of signals through analog delay line 18. Delay line driver 26 includes input 28 from voltage control oscillator 30 which includes input 31 which is adapted to be connected to a modulating signal generally designated as $g(t)$. Voltage control oscillator 30 is operative to produce an output waveform at terminal 28 which varies from a preselected center frequency in accordance with modulating signal $g(t)$. Delay line driver 26 is operative to convert the varying frequency signal appearing at 28 to a signal operative to change the delay time of analog delay line 18 so that, as a result, the instantaneous delay time of analog delay line 18 varies in accordance with modulating signal $g(t)$.

In accordance with this invention, analog delay line 18 may be considered to have a nominal time delay associated with the propagation of an electrical signal therethrough from signal input 16 to output 20. The value of the actual time delay experienced by a signal propagated through delay line 18 is determined at any particular instant in time by delay line driver 26, voltage controlled oscillator 30 and control input signal $g(t)$. For example, where $g(t)$ increases the instantaneous time delay experienced by a signal propagating along delay line 18 increases and conversely where $g(t)$ decreases from a nominal value the delay time decreases.

The operation of the generalized embodiment of this invention illustrated at FIG. 1 may be more readily understood by referring to a particular embodiment thereof.

An exemplary time delay modulator in accordance with this invention is illustrated in FIG. 2. A charge transfer delay line 32 includes an input 34 and an output 36 along with two clock inputs 38 and 40. Charge transfer delay lines are well known in the art and it will be appreciated that they take many forms. For example, bucket-brigade delay lines of the type described, in U.S. Pat. No. 3,546,490 to F. L. J. Sangster for MULTI-STAGE DELAY LINE using capacitor charge transfer or surface charge transfer devices of the type described, for example in U.S. Pat. No. 3,795,847 to Engeler et al for METHOD AND APPARATUS FOR STORING AND TRANSFERRING INFORMATION may readily be employed. Referring again to FIG. 2 clock line driver 42 provides the required control signals for operating charge transfer delay line 32 to terminals 38 and 40 thereof. The precise form of signals applied to inputs 38 and 40 depends upon the type of charge transfer delay line employed. Input 44 of clock line driver 42 is connected to voltage controlled oscillator 46. Voltage control oscillator 46 is provided with input 48 adapted to be connected to a modulating signal.

A conventional bucket-brigade delay line is illustrated at FIG. 3 and clock line driver waveforms appropriate for utilization in conjunction with a delay line of the type illustrated in FIG. 3 are depicted in schematic form in FIG. 4. Bucket-brigade delay line 50 includes an input terminal 52 corresponding to input terminal 34 of charge transfer delay line 32, an output terminal 54 corresponding to output terminal 36, and first and second clock inputs 56 and 58 corresponding to clock inputs 38 and 40 of FIG. 2. The waveforms of FIG. 4 $a$ and $b$ are applied to clock inputs 56 and 58, respectively. Bucket-brigade delay line 50 includes an input sampling stage consisting of transistor switch 60 and sampling capacitor 62. In the illustrative embodiment of this invention illustrated in FIG. 3, only four charge storage locations including transistors 64, 65, 66 and 67 and capacitors 68, 69, 70 and 71 are included. As is conventional, a single bucket-brigade delay line stage is considered to include two charge storage locations, as for example, in the embodiment of FIG. 3 transistors 64 and 65 and associated capacitors 68 and 69. FIG. 3 illustrates therefore a two stage delay line. It will be appreciated that in accordance with this invention, it may be advantageous to provide a delay line having a significantly greater number of bucket-brigade stages. Output 54 is provided by a transistor amplifier including transistor 72 and resistor 73. Transistor 72 is connected to input terminal 76 which, in turn, is adapted to be connected to a source of precharge voltage. Terminal 76 is further connected through transistor switch 78 to capacitor 71. FIG. 4 illustrates the clock waveforms preferably applied, in accordance with this invention, to clock inputs 56 and 58. It will be appreciated that the waveforms of FIG. 4$a$ and $b$ are complements of each other, that is to say when one is in the high logic state, the other is in the low logic state and the reverse is also true.

In operation, the bucket-brigade delay line of FIG. 3 propagates signal samples therethrough at a rate proportional to the frequency of the clock signals applied to clock inputs 56 and 58. In accordance with FIG. 2 where the clock signals are provided by a clock line driver which, in turn, is controlled by a voltage controlled oscillator the instantaneous clock frequency is varied in accordance with the modulating signal and the instantaneous delay through the bucket-brigade delay line of FIG. 3 similarly varies in accordance with the modulating signal.

In addition to the aforementioned U.S. Pat. to Sangster reference may advantageously be made to IEEE Transactions on Solid State Circuits, Vol. SC8; No. 2, April 1973 wherein delay lines of the type hereinabove described are extensively discussed.

In operation, the time delay of the bucket brigade delay line of the type illustrated in FIG. 3 or an equivalent charge transfer delay line is given by:

$$TD = \frac{N}{2f_c} \qquad \text{(equation 1)}$$

where N is the total number of charge storage locations (including, in the case of structures of the type illustrated in FIG. 3, two transistor switches and associated capacitors as hereinabove described) and $f_c$ is the clock frequency. As was hereinabove described, the output frequency of the waveforms illustrated at FIG. 4a and b varies in a linear manner with the modulating signal. The instantaneous radian frequency of the signals applied to clock inputs 54 and 56 may be expressed as:

$$W_i = W_o + \Delta W g(t) \qquad \text{(equation 2)}$$

where $W_i$ is the instantaneous frequency, $W_o$ is the frequency in the absence of modulation, $\Delta W$ is the frequency deviation constant and $g(t)$ is the modulating function. Since phase is the integral of frequency, the phase of the voltage controlled oscillator output may be expressed as $$\theta(t) = W_o t + \theta_o + \Delta W \int_0^t g(t)\, dt \qquad \text{(equation 3)}$$

wherein the $\theta_o$ is the output phase in the absence of modulation. Where the modulation function is a cosine modulating function having, for example, an instantaneous frequency $W_m$, equation 3 may be expressed as $$\theta(t) = W_o t + \theta_o + \frac{\Delta W}{W_m} \sin W_m t \qquad \text{(equation 4)}$$

The output waveform of the voltage controlled oscillator is $$f(t) = \sin\left(W_o t + \theta_o + \frac{\Delta W}{W_m} \sin W_m t\right) \qquad \text{(equation 5)}$$

Bucket-brigade delay line 50 samples the value of the input applied to input 52 thereof at the even zero crossings of $f(t)$. These zero crossings occur at times which will be expressed as $(t - t_n)$ which may be obtained by solving $$W_o t_n + \theta_o + \frac{\Delta W}{W_m} \sin W_m t_n = 2\pi n \qquad \text{(equation 6)}$$

wherein $n$ is a positive integer (0,1,2 etc.). As was hereinabove described each sample is delayed during its propagation through the bucket-brigade delay line by N/2 sampling events during its propagation through N stages of the bucket-brigade delay line. This is due, as will be recalled, to the fact that each effective delay stage includes two actual stages. Output events, that is to say, the occurrence of an output signal at output terminal 54 occur simultaneously with the input events and may therefore be represented as $(t - t_p)$ and may be derived from $$W_o t_p + \theta_o + \frac{\Delta W}{W_m} \sin W_m t_p = 2\pi\left(\frac{N}{2} + n\right) \qquad \text{(equation 7)}$$

The time delay for any particular sample, $n$, is $t_p - t_n$ which may be obtained by simultaneous solution of equation 6 and 7.

FIG. 5 illustrates graphically the relationship between $n$ and $t_n$. Values of $n$ occur along the ordinate and those of $t_n$ along the abscissa. Curve 80 is a sinusoidal modulating function.

$$\frac{\Delta W}{W_m} \sin W_m t$$

Curve 82 is $W_o t$ which represents the relationship between $n$ and $t_n$ in the absence of modulation, and curve 84 is the sum of curves 80 and 82:

$$W_o t + \frac{\Delta W}{W_m} \sin W_m t$$

It will be appreciated by reference to FIG. 5 and also to equation 6 that where $\theta_o = o$, $t_n$ may be readily determined by solving $$W_o t_n + \frac{\Delta W}{W_m} \sin W_m t_n = 2\pi n \qquad \text{(equation 8)}$$

where $n$ is a positive integer (0,1,2, etc.). It will be recalled that due to the nature of delay line 50 output samples occur simultaneously with input samples. The output sample representing a particular input sample occurs N/2 sample periods after the input sample. It will be appreciated with reference to FIG. 5 that where the period of the modulating waveform is equal to the unmodulated time delay that the total delay of each input sample will be the same. Referring specifically to FIG. 5, wherein N/2 = 20, it will be seen that for each N, $$t_n + N/2 - t_n = 20$$

the exact value of the unmodulated time delay. Therefore, each sample undergoes the same time delay and the net time delay modulation is zero.

Figure 6:
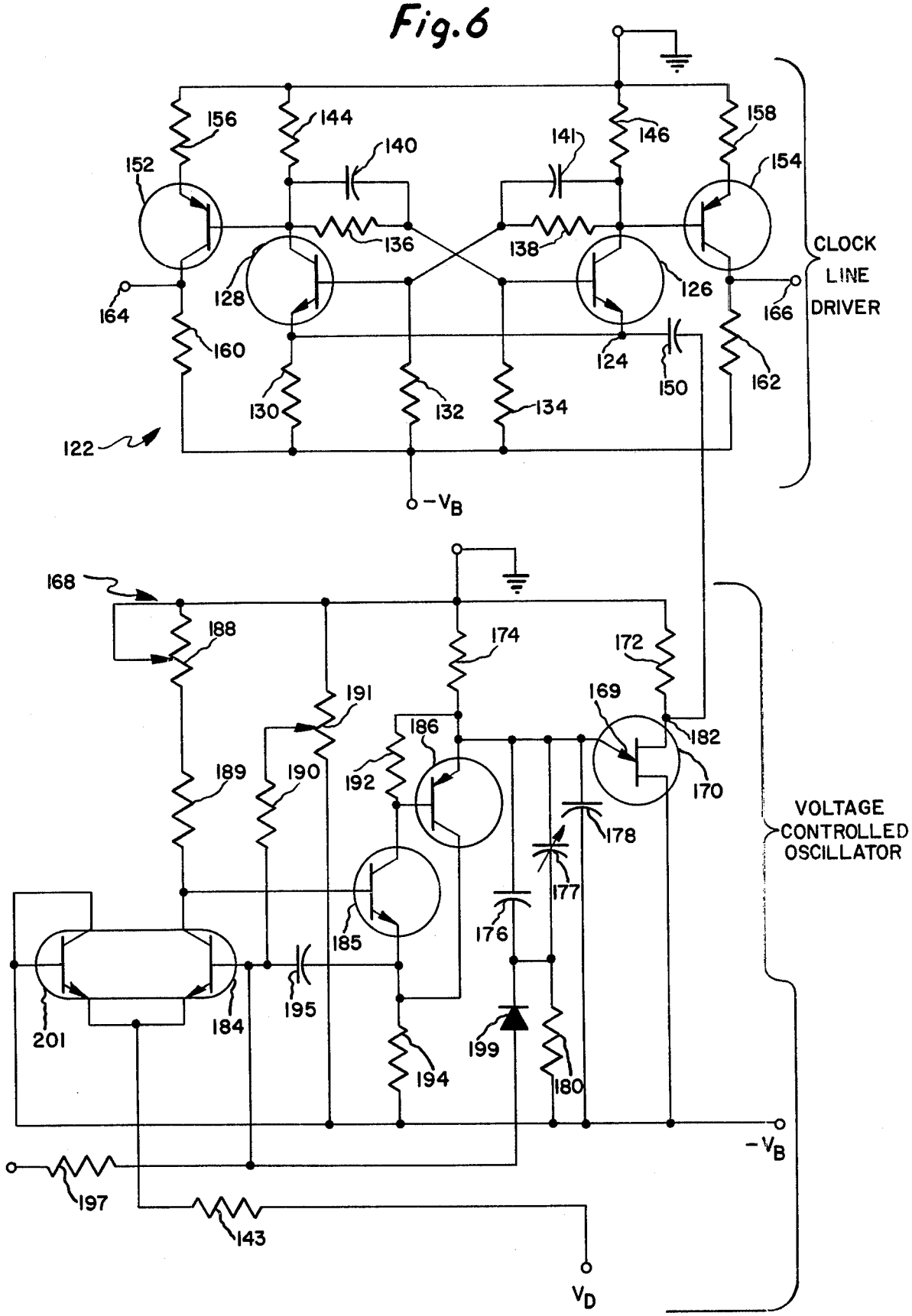
FIG. 6 is a schematic diagram of an exemplary clock line driver and voltage controlled oscillator in accordance with this invention.

FIG. 6 is a schematic diagram of an exemplary voltage controlled oscillator and clock line driver suitable to be utilized in combination with the bucket-brigade delay line of FIG. 3. The clock line driver portion 122 of FIG. 3 is a flip-flop circuit which is triggered at emitter 124 of transistor 126. Clock line driver 122 includes transistor 126 and transistor 128 which comprise a low power flip-flop circuit along with associated common emitter resistor 130, base resistors 132 and 134, coupling resistors 136 and 138 along with parallel coupling capacitors 140 and 141 and collector resistors 144 and 146. The flip-flop circuit thus far described is stable in two conditions, a first condition wherein transistor 128 is conducting and transistor 126 is nonconducting; and a second condition wherein transistor 126 is conducting and transistor 128 is nonconducting. The flip-flop circuit is transitioned between these two stable states by pulses applied to emitter 124 of transistor 126 through coupling capacitor 150. Amplifier transistors 152 and 154 along with associated emitter resistors 156 and 158, respectively, and collector resistors 160 and 162 provide signals at output terminals 164 and 166 which may be directly applied to terminals 56 and 58 of the bucket-brigade delay line of FIG. 3.

Clockline driver section 122 of FIG. 6 may be advantageously driven through capacitor 150 by a wide variety of circuits. Voltage controlled oscillator 168 is an exemplary circuit and may readily be modified by one skilled in the art without departing from the true spirit and scope of this invention. The voltage control oscillator of FIG. 6 includes a unijunction oscillator including transistor 170, load resistor 172 and a gate triggering circuit including resistor 174, capacitors 176, 177 and 178, and resistor 180. Unijunction transistor 170 produces an output pulse at output 182 thereof whenever the voltage at gate 169 reaches a preselected value. Transistors 184, 185 and 186 comprise an operational amplifier circuit along with associated resistors 188 through 194 and capacitor 195. A modulating signal is applied through resistor 197 to the base of transistor 184 which is the input terminal of the operational amplifier including transistors 184, 185 and 186 and the associated components. Each time unijunction transistor 175 fires a fixed quantity of charge is coupled to the base of transistor 184 by capacitors 176 and 177 and diode 199. Transistor 201 which is physically located in the same case as transistor 184 provides temperature compensation for the input stage of the operational amplifier. The operation of voltage controlled oscillator 168 may be readily understood by considering that the average current fed back to the base of transistor 184 is proportional to the frequency of oscillation of unijunction transistor 170 and further, since the operational amplifier including transistors 184 through 186 will tend to maintain its input node, that is the base of transistor 184, at zero volts, the frequency of oscillation must be proportional to the input voltage to maintain the summing point at zero potential.

As will be appreciated by one skilled in the art, many voltage controlled oscillators might advantageously be employed in place of the exemplary oscillator 168 hereinabove described. It is to be understood that any voltage controlled oscillator which provides a signal of output frequency varying in accordance with an input signal may readily be employed.

The type of output signal produced by a time delay modulator in accordance with this invention is determined by the signals applied to the time delay modulator. A wide variety of useful output signals may be produced by providing appropriate signal inputs to the time delay modulator. Outputs may usefully be produced which are equivalent to the phase modulated combination of the two inputs to the time delay modulator. Further, outputs may be produced which are the frequency modulated combination of the two inputs. Outputs may also be produced where desired which are especially suited to the secure transmission of information, as for example, when a speech signal is applied to one input of a time delay modulator and a coding signal is applied to the second input.

A time delay modulator in accordance with this invention has several advantages over conventional frequency or phase modulators used to produce similar outputs. Conventional phase and frequency modulators of the type known in the art produce waveforms which are in some instances, approximations to the desired waveforms in one or more respects. As is well known, frequency or phase modulators wherein the value of an element of a filter circuit is varied in order to produce phase differences between the input and output signals to the filter, nonlinearities often times result. Further, the magnitude of the frequency or phase modulation obtainable is limited by the change in characteristics of the filter as the characteristics of an element are varied. For example, it is often times the case that a frequency modulator operating at a given carrier frequency will provide a frequency deviation therefrom which is severely limited as a percentage of the carrier frequency. As the frequency deviation increases it is a further disadvantage that nonlinearities become more severe. Time delay modulators in accordance with this invention are capable of providing close to ideal frequency modulators having the capability to produce signals with deviations far greater than heretofore possible.

Figure 7:
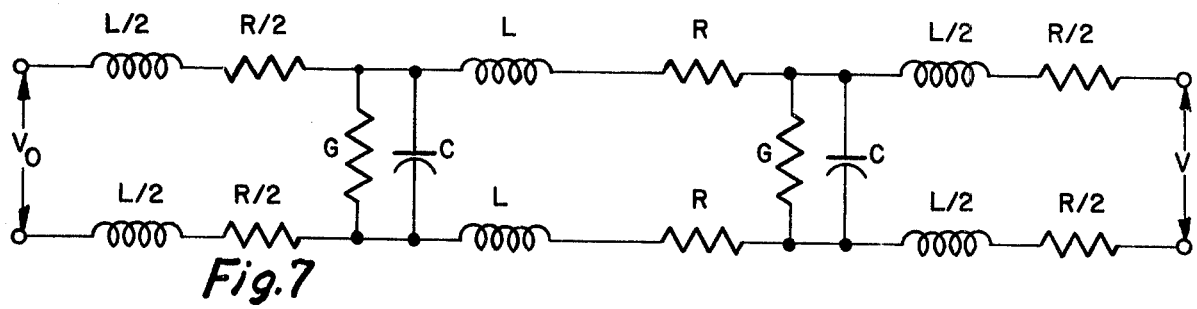
FIG. 7 is a schematic diagram of a generalized transmission line.

FIG. 7 is a schematic diagram of a lumped constant transmission line. The output voltage of the transmission line may be expressed in terms of the input voltage by the following equation:

$$V = V_o e^{(j\omega t - \gamma x)} \quad \text{(equation 1)}$$

wherein $V_o$ is the input voltage, $V$ is the output voltage, $\omega$ is the radian frequency, $t$ is time and $\gamma$ is the complex propagation coefficient which may be described as follows:

$$\gamma = \sqrt{(R + j\omega L)(G + j\omega C)} \quad \text{(equation 2)}$$

It is to be understood that FIG. 7 represents a single section of an extended lumped constant transmission line of unit length $x$. In equation 2, R and L are the series resistance and inductance of the transmission line per unit length while G and C are the shunt conductance and capacitance per unit length. $\gamma$ may be approximated as $$\gamma = 1/2 \left[ \sqrt{\frac{R}{L/C}} + G\sqrt{L/C} \right] + j \left[ \omega \sqrt{LC} \right] \quad \text{(equation 3)}$$

which is in the form $$\gamma = \alpha + j\beta \quad \text{(equation 4)}$$

where it is assumed that the transmission line is a lossy line. If the further assumption that the losses in the line are negligible is made, the first term of equation 3 approaches zero and $$\gamma = j\omega\sqrt{LC} \quad \text{(equation 5)}$$

which when substituted into equation 1 yields $$V = V_o e^{j\omega(t - \sqrt{LC}x)} \quad \text{(equation 6)}$$

Inspection of equation 4 reveals that the waveform appearing at the output of the transmission line of FIG. 7 is delayed from that applied to the input by time equal to $x\sqrt{LC}$ seconds. It is clear, therefore, that by varying either L, C or both L and C that time delay modulation of a signal applied to a transmission line of the type illustrated in FIG. 7 may be obtained.

Figure 8:
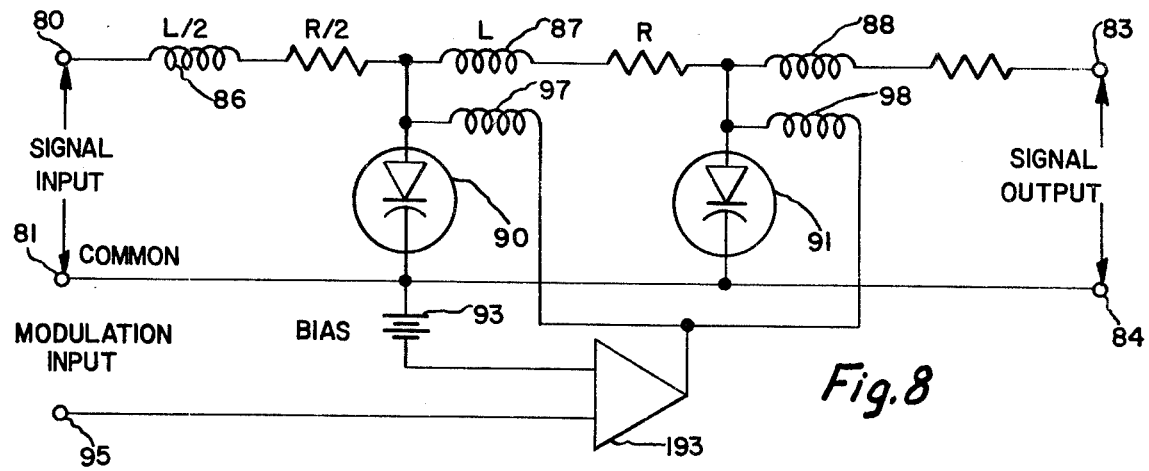
FIG. 8 is a schematic diagram of a variable transmission line delay line in accordance with this invention.

FIG. 8 illustrates a single section of a variable delay line suitable for incorporation in a time delay modulator in accordance with this invention. An input signal applied to input terminals 80 and 81 is propagated along the transmission line and appears after a time delay at output terminals 83 and 84. The amount of delay experienced by a signal through the transmission line section of FIG. 8 is determined by the magnitudes of inductors 86, 87 and 88 and capacitors 90 and 91. Capacitors 90 and 91 are illustrated as voltage variable capacitors characterized in that the magnitude of the capacitance is proportional to the magnitude of voltage applied across the respective capacitors. Voltage variable capacitors are well known in the art and are, in fact, only one way of providing a capacitance which is controllable in accordance with a modulating signal. For example, electrically switched capacitors, or digitally controlled capacitors may readily be employed in place of varactors 90 and 91. Amplifier 193 which is connected to a source of modulation at terminal 95 provides a voltage through isolating inductors 97 and 98 to varactors 90 and 91, respectively. The common terminals of varactors 90 and 91 are returned through bias voltage source 93 to amplifier 193. Amplifier 193 may conveniently be an operational amplifier or any other amplifier having input characteristics suitable to be connected to the source of modulation desired to be utilized in conjunction with a time delay modulator in accordance with this invention. It will be appreciated that the transmission line of FIG. 8 will, in operation, have voltages present on the input and output terminals thereof due to the voltages required to operate capacitors 90 and 91. Where desired, these voltages may be eliminated through the use of suitable isolating capacitors as, for example, in series with varactors 90 and 91 between the said varactors and inductors 87 and 88.

Figure 9:
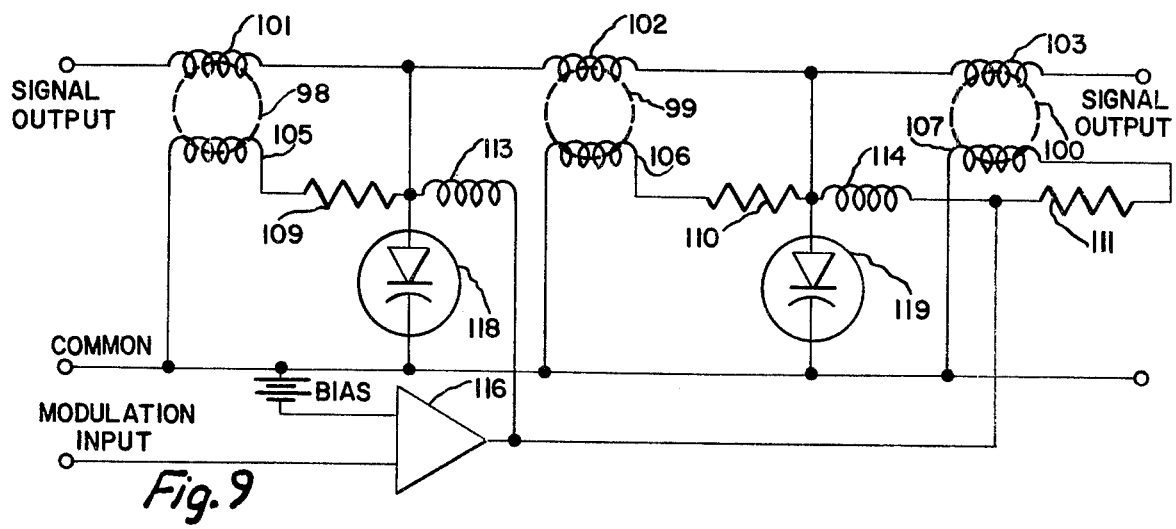
FIG. 9 is a schematic diagram of another variable transmission line delay line in accordance with this invention.

FIG. 9 is a schematic diagram of a transmission line suitable for incorporation in a time delay modulator in accordance with this invention wherein both inductance and capacitance are varied in accordance with a modulating signal in order to provide a constant characteristic impedance. It will be appreciated that the impedance of a transmission line of the type illustrated in FIG. 9 is given by $$Z_o = \sqrt{L/C} \qquad \text{(equation 7)}$$

and if, therefore, the ratio of L to C is maintained at a constant value, the characteristic impedance will likewise be constant. The transmission line section of FIG. 9 includes saturable core inductors 98, 99 and 100 each of which includes first and second windings. The first winding of each inductor, 101, 102 and 103, respectively, comprise the active windings of the transmission line section. The second windings of each inductor 105, 106 and 107, respectively, are the control windings which are connected through series resistors 109, 110 and 111 and inductors 113 and 114 to amplifier 116 which functions substantially identically to amplifier 93 of FIG. 8. Varactors 118 and 119 are similarly connected, through inductors 113 and 114 to amplifier 116. Varactors 118 and 119 are substantially identical in function and type to varactors 90 and 91 of FIG. 8, and may be similarly selected. Saturable core inductors 98, 99 and 100 are preferably selected to maintain a constant ratio of inductance to capacitance with variations in the signal applied to amplifier 116. In this way the characteristic impedance of the portion of transmission line illustrated at FIG. 9 will be maintained at a constant value and variations in amplitude in signals propagated therethrough will be minimized with changes in modulation.

Saturable core inductors 98, 99 and 100 may be of a variety of convenient types. For example, a saturable core of suitable characteristics at the frequency of the signal applied to the transmission line of FIG. 9 may readily be provided having first and second windings thereon, the first windings of an appropriate magnitude to provide the desired inductance characteristics and the second winding selected to provide for partial or full saturation of the core upon the passage of d.c. current through said second winding. Prefabricated saturable core inductors may be procured, for example, from Vari-L Company, 3883 Monaco Parkway, Denver, Colorado.

Another exemplary variable delay line which may usefully be employed in accordance with this invention is illustrated in FIG. 10. An hermetically sealed vessel generally designated at 220 is provided having a generally hollow interior as will be clearly seen by reference to FIG. 11 wherein a section of vessel 200 is shown. Vessel 200 includes top and bottom electrically conductive plates 222 and 224 and insulating side walls 226 through 229. Plates 222 and 224 are provided with electrical terminals ohmically attached thereto, 231 and 233 which are adapted to be connected to a source of electrical signals as will be more fully described hereinbelow. Side wall 227 is provided with input transducer 235 and output transducer 237 each of which extends through side wall 227 to the interior of vessel 220. Transducers 235 and 237 are electrical-to-acoustical transducers and include electrical contacts 240 through 243 thereon. Side wall 226 is provided with fitting 246 extending therethrough for the introduction of a gas into the interior of vessel 220. The interior surfaces of side walls 227 and 229 are acoustically reflective surfaces to allow as nearly as practical for the complete reflection of acoustic waves impinging thereon.

In operation, an electrical signal applied to terminals 240 and 241 of transducer 235 is converted to an acoustic wave which travels in a generally zig-zag path reflecting alternately from the reflective inner surfaces of side walls 229 and 227 as illustrated by the dotted line in FIG. 9, until the wave impinges upon output transducer 237 wherein it is converted again to an electrical signal which appears at terminals 242 and 243. The physical length of the path traversed by the acoustic wave depends upon the dimensions of vessel 220 and upon the angle of reflection at each interior side wall. It will be appreciated that if a sufficiently small angle is used, a large number of reflections may be obtained within a relatively small physical vessel.

As is well known, the velocity of propagation of a wave in a gas is a function of the equation of state for the particular gas ($pv \approx rt$) the molecular weight, and the specific heat. For small displacements relative to the wavelength of the signal the velocity is given by $$C = (kt)^{1/2} \qquad \text{(equation 8)}$$

where $k$ is the gas constant and $t$ is the temperature in degrees Kelvin. Modulation of the time delay in a delay line of the type shown in FIG. 10 may be effectively accomplished by varying the temperature of the gas. The structure of FIG. 10 is well suited to modulating the temperature of a gas by applying an electrical signal to terminals 233 and 231 which form the plates of a capacitor having the gas as a dielectric thereof.

FIG. 12 is an alternative embodiment of a delay line in accordance with this invention which is substantially similar to the delay line of FIG. 10 save only for the physical arrangement thereof. A generally circular vessel 250 is provided having top and bottom electrically conductive plates 252 and 253 which may be readily seen by reference to FIG. 13 which is a section through the vessel of FIG. 12. A generally circular insulating wall 255 maintains a separation between plates 252 and 253 and creates a cavity 257 therebetween suitable for the introduction of gas therein through, for example, port 260. An input electroacoustical transducer 262 and an output transducer 264 are provided which extend through wall 255 to the interior of vessel 250 for introducing an acoustic wave therein. The propagation of the wave is generally indicated by the dotted line and is to be considered to travel in a substantially zig-zag course which rotates around the circumference of vessel 250 before impinging upon output transducer 264. In this way a long path length is obtained in a relatively small physical vessel as was the case in conjunction with the vessel of FIG. 10 Terminals 262 and 264 are provided ohmically contacting plates 252 and 253 in order to allow for the application of voltage thereto in order to provide heating of the gas as was hereinabove described.

Figure 14:
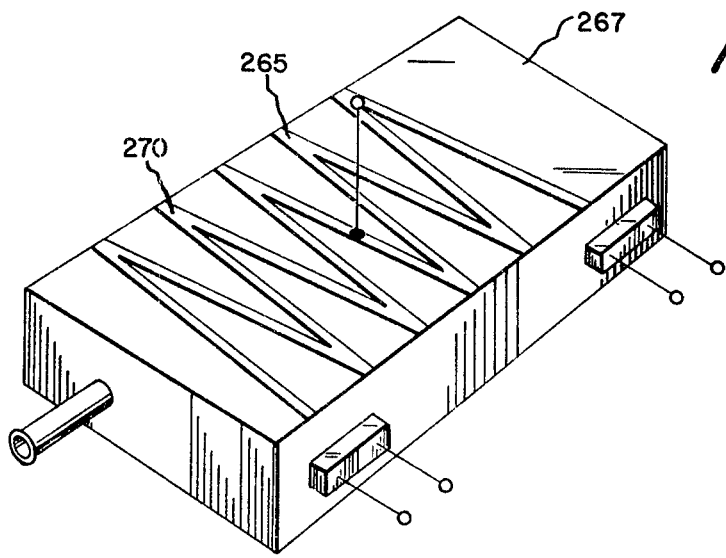
FIG. 14 is a diagram of an alternative method for providing heating of an electroacoustic delay line.
Figure 15:
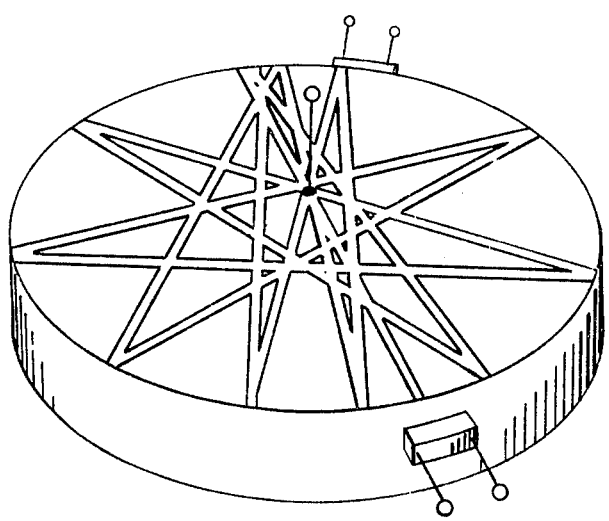
FIG. 15 is yet another alternative embodiment of an electroacoustic delay line in accordance with this invention.

FIGS. 14 and 15 are exemplary embodiments of this invention wherein the vessels of FIGS. 9 and 11 are provided with selective metallizations on the top and bottom surfaces thereof to provide localized capacitor regions in those areas of the vessel where the acoustic wave is actually propagated. For example, referring now to FIG. 14, it will be noted that a zig-zag pattern electrode 264 is provided on an insulating plate 267. An ohmic contact 270 provides for the application of voltage to zig-zag pattern electrode 265. It is to be understood that a second patterned electrode not visible in FIG. 14 is present on the bottom plate of the vessel. In all other respects, the vessel of FIG. 14 is identical to that of FIG. 10. FIG. 15 illustrates in view a patterned electrode suitable for use in conjunction with a vessel of the type illustrated in FIG. 12.

Figure 16:
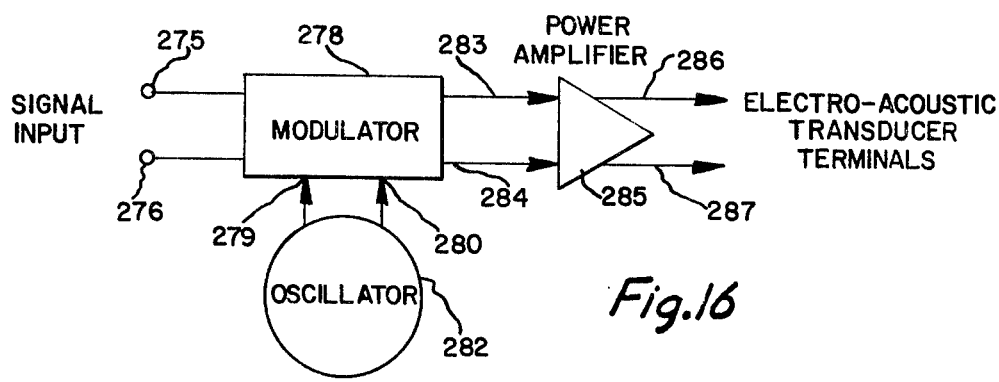
FIG. 16 is a block diagram schematic of signal conditioning means for utilization in conjunction with an electroacoustic delay line.

FIG. 16 is a partial block diagram schematic of a single input circuit which may advantageously be employed in conjunction with any of the delay lines of FIGS. 10, 12, 14 or 15. A modulating signal is applied to input terminals 275 and 276 which are connected to modulator 278. Modulator 278 further includes additional terminals 279 and 280 which are connected to oscillator 282. The output of modulator 278 is connected to power amplifier 285 the output terminals of which are adapted to be connected to the electroacoustic transducer 235 of FIG. 10 or 262 of FIG. 12. Modulator 278 may be of any convenient type as, for example, an amplitude modulator, a frequency modulator, a phase modulator of any other type which will produce an output signal which is the combination of two input signals in a linear manner.

Figure 17:
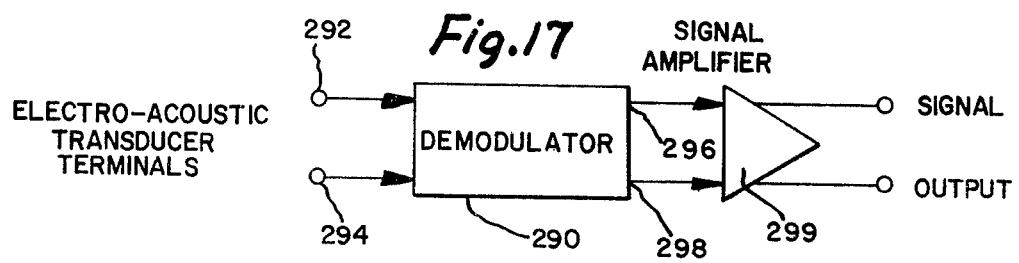
FIG. 17 is a block diagram schematic of output signal conditioning means for utilization in conjunction with an electroacoustic delay line.

FIG. 17 is a block diagram schematic of an output circuit suitable for utilization in conjunction with one of the delay lines of FIGS. 10 and 12. A demodulator 290 is provided having first and second input signals 292 and 294 which are adapted to be connected to the output of electroacoustical transducer 237 or 262 of FIGS. 10 or 12, respectively. Demodulator 290 is selected in accordance with the selection of modulator 278 in order to provide a compatible demodulating function. Output terminals 296 and 298 of demodulator 290 are connected to amplifier 299, the output of which is the output of the time delay modulator. Amplifiers 285 and 299 may be selected from any of the number of amplifier circuits known in the art which provide the appropriate power levels, impedances and other required operating characteristics.

Figure 18:
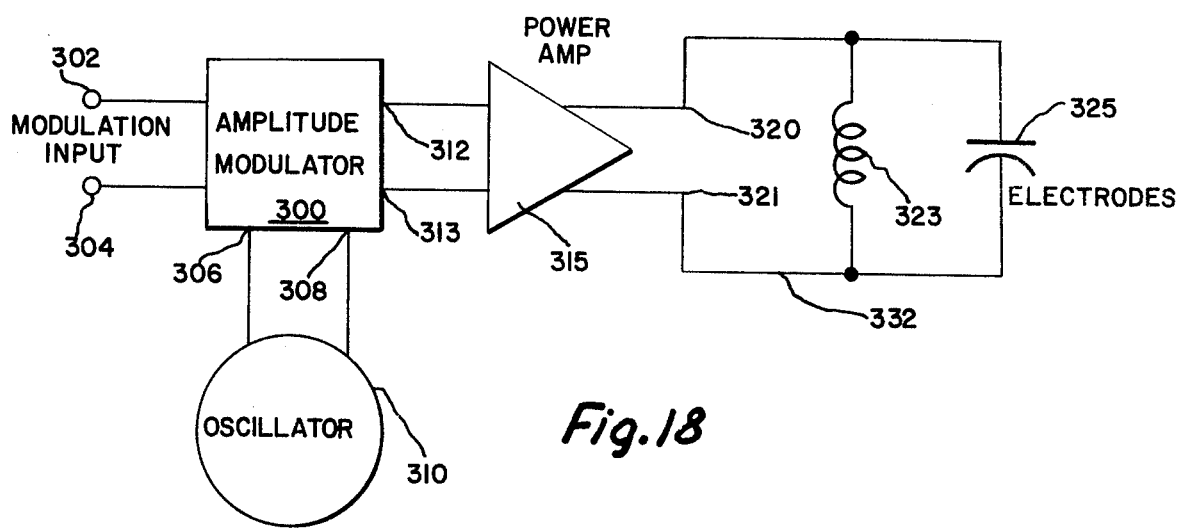
FIG. 18 is a partial block diagram schematic of a gas temperature modulator for utilization in conjunction with an electroacoustic delay line in accordance with this invention.

FIG. 18 is a partial block diagram schematic of a gas temperature modulator in accordance with this invention for utilization in conjunction with the delay lines of FIGS. 10 and 12. Amplitude modulator 300 is provided having input terminals 302 and 304 adapted to be connected to a source of modulation which is one of the modulating inputs of the time delay modulator. Amplitude modulator 300 further includes inputs 306 and 308 which are connected to oscillator 310 which oscillator operates at the frequency of the signal propagated through the gas delay lines. Oscillator 310 is chosen, therefore, to provide an appropriate frequency for utilization in conjunction with the electroacoustic transducers of the delay line. Outputs 312 and 313 of amplitude modulator 300 are connected to power amplifier 315 which may be selected from any of the many types of power amplifiers known in the art which will operate into a load as will be described. Output terminals 320 and 321 of power amplifier 315 are connected to parallel resonant circuit 332 which includes inductor 323 and capacitor 325. Capacitor 325 is the capacitor formed between the plates of the gas delay line, that is to say, between plates 222 and 224 of FIGS. 10 and 11; or between plates 252 and 253 of FIGS. 12 and 13 or between the patterned zig-zag electrodes of FIGS. 14 or 15. Connection may be made to the appropriately selected numbered ohmic terminals hereinabove described which are attached to said plates. Resonant circuit 332 is advantageously designed to be resonant at the frequency of oscillator 310 so that maximum power will be delivered to the gas inside the delay line vessels.

It will be appreciated that the propagation and velocity inside a gas delay line of the type hereinabove described will depend upon the type of gas utilized. For example, carbon disulphite gas has a propagation velocity of 189 meters per second at standard temperature and pressure. In order to obtain a time delay of 0.1 seconds, it will be appreciated that 18.9 meters of path length are required but it will be seen that this path length may readily be provided in accordance with the delay lines of FIGS. 10 and 12 in a relatively small physical package. Further, reference to equation 8 ($C = (kt)^{1/2}$) shows that relatively substantial changes in time delay may be accomplished by moderate changes in temperature.

Figure 19:
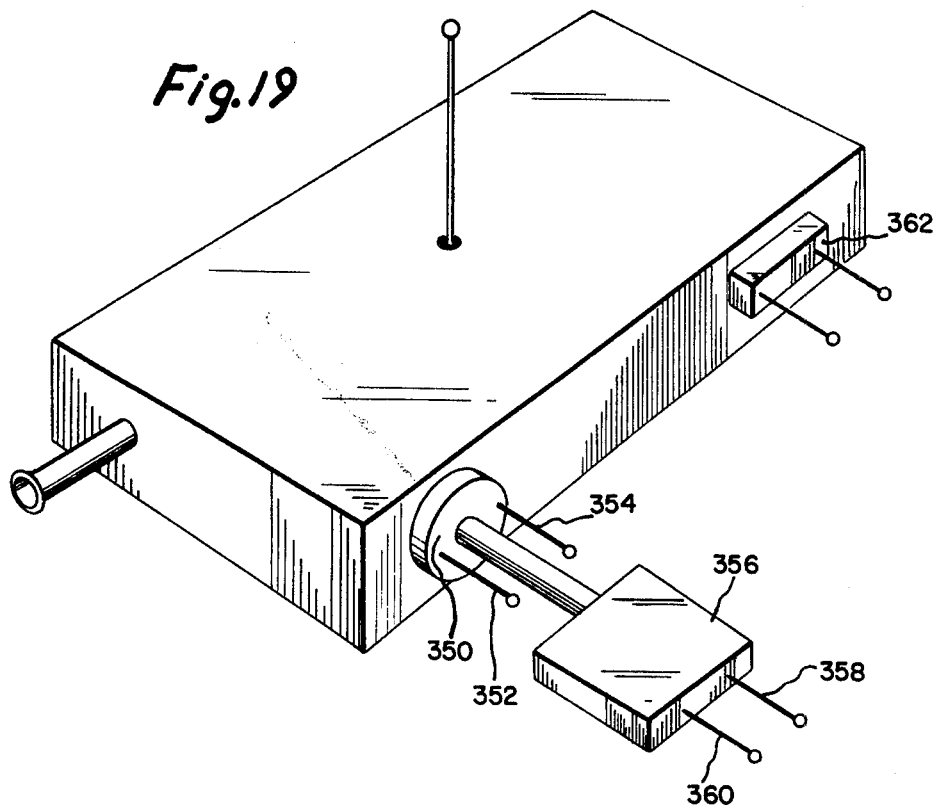
FIG. 19 is a diagram of an alternative method for providing gas temperature modulation in accordance with this invention.

Referring now to FIG. 19 yet another alternative embodiment of this invention is illustrated wherein an electroacoustical gas delay line of the type hereinabove described is utilized in conjunction with a laser for providing modulation of the temperature of the gas. A vessel substantially identical to that described in conjunction with FIG. 10 is provided which vessel may be constructed, however, without the need for capacitive top and bottom plates. An electroacoustic transducer 350 is provided having a pair of terminals 352 and 354 for the energization thereof and an orifice which, in this case, is located in the center of the transducer for the insertion of a laser therethrough. Laser 356 which is shown in block form only is provided with modulating terminals 358 and 360 thereon for the application of a modulating signal to the laser.

The interior reflecting side walls of the delay line of FIG. 19 are both acoustically and optically reflecting so that the energy emitted by a laser 356 traverses substantially the same path as the acoustical energy emitted by electroacoustic transducer 350. The intensity of the laser beam is modulated by the signal applied to terminals 358 and 360 in a manner which depends upon the type of laser utilized. Modulation of laser beams is well known in the art and may be accomplished, for example, by external electro-optic modulators inserted between the laser source and the delay line; by internal electro-optic modulators associated with the laser device itself, as for example, by modulating the power source of the laser. In an exemplary embodiment of this invention, a laser may be employed which utilizes radio frequency excitation of a gas in order to produce the laser output. Modulation of the radio frequency source wil accomplish modulation of the laser output. In another exemplary embodiment of this invention, an injection luminescent diode laser may be employed which produces an output proportional to the electrical current falling therein. Modulation of the electrical current will provide modulation of the laser output. The delay line of FIG. 19 is provided with output electrical acoustic transducer 362 which may be of similar type to that employed in the foregoing acoustic delay lines hereinabove described. It is, of course, necessary that electroacoustic transducer 362 be substantially unaffected by the laser energy which impinges thereon along with the acoustic energy. The precise form of the delay line of FIG. 19 may be varied somewhat from that described. For example, laser 356 need not be located in the center of an annular electroacoustic transducer but may be beside, or, in fact, inside the delay line so long as it does not interfere with the production of acoustic energy.

While this invention has been described in conjunction with several exemplary embodiments thereof, it will be apparent to one skilled in the art that many modifications and changes may be made without departing from the true spirit and scope of the invention. For example, a number of exemplary controllable delay lines have been described wherein the rate of propagation of a signal from a signal input to a signal output is controlled by a signal applied to a control input which has variously been a voltage controlled oscillator, a laser modulator, an electrical capacitor or an amplifier connected to controllable inductors and/or capacitors in a transmission line. It will be appreciated that each of these exemplary embodiments provides a similar function in a somewhat different fashion and it will be further appreciated that other devices for accomplishing the variable delay line function will occur to those skilled in the art.

It is a feature of this invention that it may equally well be employed with a wide variety of signal inputs and modulation inputs as has been hereinabove described. The invention itself is not limited to any particular form of input waveforms either to the signal input terminals or the modulation (control) input terminals of the device. Where, for example, the signal input is a sine wave of relatively high frequency and the control input is a voice frequency signal of somewhat lower frequency, it will be appreciated that the output of a time delay modulator in accordance with this invention will be a frequency modulated signal of the type which has been heretofore produced by other types of modulators. The invention herein resides not in any particular combination of signal inputs and modulation inputs but rather in a modulator which may usefully be employed in a wide variety of systems to produce a similarly wide variety of output signals which may be adapted to various purposes.

What is claimed is:

1. A time delay modulator for varying the instantaneous time base of a substantially sinusoidal carrier wave signal in accordance with a modulating signal, said modulator comprising:
   a charge transfer delay line having an input, an output and a control input, said input adapted to receive an unmodulated carrier wave signal wherein the rate of transfer of charge along said delay line is proportional to said modulating signal;
   delay line driver means having an input and an output, the output connected to the control input of said delay line; and
   a voltage controlled oscillator having a control input and an output, the output connected to the input of said delay line driver means, and the control input adapted to receive a modulating signal, said modulating signal causing the output frequency of said oscillator to deviate from a nominal frequency by an amount proportional to the magnitude of said modulating signal, said modulating signal being an information signal of substantially lower frequency than said carrier wave signal, whereby the instantaneous time base of said carrier wave signal is varied by said delay line in accordance with the modulating signal and the output of said variable delay line is a frequency modulated signal.

2. The time delay modulator of claim 1 wherein said carrier wave signal comprises two or more sinusoidal signals.

3. The time delay modulator of claim 1 wherein said carrier wave signal is a speech signal.

4. The time delay modulator of claim 1 wherein said information signal is a coding signal.

* * * * *